United States Patent
Nakai (10) Patent No.: US 10,950,466 B2
(45) Date of Patent: Mar. 16, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventor: Hitoshi Nakai, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/302,375

(22) PCT Filed: May 29, 2017

(86) PCT No.: PCT/JP2017/019904
§ 371 (c)(1),
(2) Date: Nov. 16, 2018

(87) PCT Pub. No.: WO2017/221639
PCT Pub. Date: Dec. 28, 2017

(65) Prior Publication Data
US 2019/0279885 A1    Sep. 12, 2019

(30) Foreign Application Priority Data

Jun. 24, 2016 (JP) .............................. JP2016-125628

(51) Int. Cl.
H01L 21/67 (2006.01)
H01L 21/306 (2006.01)
(Continued)

(52) U.S. Cl.
CPC .......... *H01L 21/67051* (2013.01); *B05D 1/40* (2013.01); *B05D 3/04* (2013.01);
(Continued)

(58) Field of Classification Search
CPC . B01D 1/14; B05D 3/04; B05D 3/046; B05D 1/40; B05D 3/10; H01L 21/67023;
(Continued)

(56) References Cited

U.S. PATENT DOCUMENTS

| 5,939,139 A | 8/1999 | Fujimoto ...................... 427/240 |
| 2012/0223054 A1* | 9/2012 | Azuma ............. H01L 21/67028 216/83 |

(Continued)

FOREIGN PATENT DOCUMENTS

| JP | 2002359227 A | * 12/2002 |
| JP | 2003332285 A | * 11/2003 |

(Continued)

OTHER PUBLICATIONS

PCT/IB/326 Notification Concerning Transmittal of International Preliminary Report on Patentability including PCT/IB/373 and PCT/ISA/237 (in Japanese) dated Jan. 3, 2019 for International Application No. PCT/JP2017/019904.

(Continued)

*Primary Examiner* — Mikhail Kornakov
*Assistant Examiner* — Richard Z. Zhang
(74) *Attorney, Agent, or Firm* — Ostrolenk Faber LLP (57) ABSTRACT

A filler solution is supplied to an upper surface of a substrate, forming a coating that is a film of the filler solution. Clearance in the structure on the upper surface of the substrate is filled with the filler solution. Then, a stripping solution is applied to a peripheral region of the upper surface of the substrate, to strip off a portion of the coating formed on the peripheral region. Also, a gas is injected toward a boundary portion between the peripheral region and an inner region of the upper surface of the substrate, to accelerate solidification of an outer edge portion of the coating formed on the inner region, to suppress the spread of the coating from the inner region to the peripheral region. A substrate holder/rotator, fluid supplies, and a gas injection part are provided to carry out the above process.

7 Claims, 3 Drawing Sheets

(51) Int. Cl.
| | | |
|---|---|---|
| *B05D 3/04* | (2006.01) | |
| *B05D 1/40* | (2006.01) | |
| *B05D 3/10* | (2006.01) | |
| *B05D 3/12* | (2006.01) | |
| *H01L 21/304* | (2006.01) | |
| *B05C 11/08* | (2006.01) | |
| *B05C 11/10* | (2006.01) | |

(52) U.S. Cl.
CPC ............... *B05D 3/10* (2013.01); *B05D 3/12* (2013.01); *H01L 21/304* (2013.01); *H01L 21/306* (2013.01); *H01L 21/30604* (2013.01); *H01L 21/6715* (2013.01); *H01L 21/67023* (2013.01); *B05C 11/08* (2013.01); *B05C 11/10* (2013.01)

(58) Field of Classification Search
CPC ........... H01L 21/67028; H01L 21/6704; H01L 21/67051; H01L 21/6715; H01L 21/6708; H01L 21/306; H01L 21/304; H01L 21/30604; H01L 21/02087; B05C 11/08; B05C 11/10
See application file for complete search history.

(56) References Cited

U.S. PATENT DOCUMENTS

| | | | | |
|---|---|---|---|---|
| 2013/0020284 A1 | | 1/2013 | Osada et al. ................... 216/57 |
| 2014/0144465 A1* | | 5/2014 | Kaneko ............ H01L 21/67051 |
| | | | | 134/4 |
| 2015/0064911 A1 | | 3/2015 | Kaneko et al. ............... 438/694 |
| 2015/0090302 A1 | | 4/2015 | Fujiwara et al. ............... 134/26 |
| 2016/0035561 A1 | | 2/2016 | Aibara et al. |

FOREIGN PATENT DOCUMENTS

| | | |
|---|---|---|
| JP | 2006-210580 A | 8/2006 |
| JP | 2014-123704 A | 7/2014 |
| JP | 2015-023172 A | 2/2015 |
| JP | 2015-046449 A | 3/2015 |
| JP | 2015-050414 A | 3/2015 |
| JP | 2015-065396 A | 4/2015 |
| JP | 2015-070018 A | 4/2015 |
| JP | 2015-070019 A | 4/2015 |
| JP | 2016-036012 A | 3/2016 |
| KR | 10-0447012 B1 | 11/2004 |
| KR | 10-0637952 B1 | 10/2006 |
| KR | 10-2014-0103244 A | 8/2014 |

OTHER PUBLICATIONS

PCT/IB/338 Notification of Transmittal of Translation of the International Preliminary Report on Patentability including PCT/IB/373 and PCT/ISA/237 (in English) dated Jan. 3, 2019 for International Application No. PCT/JP2017/019904.
International Search Report dated Aug. 1, 2017 in corresponding PCT International Application No. PCT/JP2017/019904.
Written Opinion dated Aug. 1, 2017 in corresponding PCT International Application No. PCT/JP2017/019904.
Decision to Grant of Patent dated Oct. 27, 2020 in corresponding Korean Application No. 10-2018-7033328.

* cited by examiner

SUBSTRATE PROCESSING METHOD AND SUBSTRATE PROCESSING APPARATUS

CROSS-REFERENCE TO RELATED APPLICATIONS

The present application is a 35 U.S.C. §§ 371 national phase conversion of PCT/JP2017/019904, filed May 29, 2017, which claims priority to Japanese Patent Application No. 2016-125628, filed Jun. 24, 2016, the contents of both of which are incorporated herein by reference. The PCT International Application was published in the Japanese language.

TECHNICAL FIELD

The present invention relates to a technique for processing a substrate.

BACKGROUND ART

In the process of manufacturing semiconductor substrates (hereinafter, simply referred to as "substrates"), various processing has conventionally been performed on the substrates. For example, chemical solution processing such as etching is performed on the surface of a substrate by ejecting a chemical solution from nozzles to the top of the substrate on which a resist pattern (i.e., a structure that is a group of a large number of fine structural elements) is formed.

Such a substrate ordinarily has no pattern on a peripheral region of its upper surface, and has a pattern only on an inner region located inward of the peripheral region. The substrate processing apparatus disclosed in Japanese Patent Application Laid-Open No. 2006-210580 (Document 1) performs processing (so-called "bevel etching") for forming a film on the entire upper surface of a substrate and then removing the film formed on the peripheral region by etching.

Japanese Patent Application Laid-Open Nos. 2015-70018 (Document 2) and 2015-70019 (Document 3) propose techniques for avoiding a situation where a processing liquid ejected toward the peripheral region of a substrate splashes as a result of collision with a processing liquid on the peripheral region and enters the inner region while processing is performed on the peripheral region. Specifically, in the substrate processing apparatus according to Document 2, a gas nozzle is disposed upstream of a processing liquid nozzle in the direction of rotation of a substrate so that a gas is injected from the gas nozzle toward the peripheral region. Thus, an old processing liquid that has been supplied one cycle before from the processing liquid nozzle and has not been shaken off during one rotation of the substrate is removed by the gas injected from the gas nozzle. This suppresses a collision between the processing liquid newly supplied from the processing liquid nozzle and the old processing liquid on the substrate.

The substrate processing apparatus according to Document 3 ejects a first processing liquid toward the peripheral region of a substrate, then stops the ejection of the first processing liquid, and injects a gas toward the peripheral region. Thus, the first processing liquid is removed from the top of the peripheral region. Thereafter, a second processing liquid is ejected toward the peripheral region. This suppresses a collision between the second processing liquid and the first processing liquid on the substrate.

Execution of the chemical solution processing on the substrate is followed by execution of rinse processing for removing chemical solutions by supplying deionized water or other liquids to the substrate and dry processing for removing liquids on the substrate by rotating the substrate at high speed. If the rinse processing and the dry processing are performed in succession when the aforementioned structure is formed on the surface of the substrate, a liquid surface of deionized water is formed between two adjacent structural elements in the course of drying. In this case, the structural elements may collapse due to the surface tension of the deionized water acting on the structural elements. In view of this, techniques have been proposed in which clearance in the structure (i.e., between structural elements) is filled with a filler before execution of dry processing so as to prevent the collapse of structural elements during dry processing. The filler on the substrate will be sublimated and removed by, for example, a separate apparatus performing dry etching after dry processing. Note that the unnecessary filler adhering to the peripheral region of the substrate is stripped off and removed from the top of the substrate by supplying a stripping agent to only the peripheral region of the substrate, because there is a risk of that filler undesirably soiling a transport mechanism during transport of the substrate.

Incidentally, in the case of removing the filler on the peripheral region of the substrate, the stripping agent supplied to the peripheral region causes slack in the outer edge portion of a coating of the filler on the inner region. This incurs the risk of part of the outer edge portion of the coating on the inner region spreading radially outward in streaks by centrifugal force with an increase in the rotation speed of the substrate during dry processing, which is performed after removal of the coating of the filler on the peripheral region. That is, there is a risk of part of the coating remaining in streaks on the peripheral region even after the end of the processing for removing the coating on the peripheral region. If the substrate in such a condition is transported out of the processing apparatus, the coating on the peripheral region may adhere to a mechanism for transporting the substrate.

SUMMARY OF INVENTION

The present invention is intended for a substrate processing method of processing a substrate, and it is an object of the present invention to suppress the spread of a coating on the inner region to the peripheral region of the substrate.

A substrate processing method according to the present invention includes a) holding a substrate in a horizontal position, the substrate having a structure formed on an upper surface thereof, b) supplying a processing liquid to the upper surface of the substrate to form a coating that a film of the processing liquid on the upper surface and to fill clearance in the structure with the processing liquid, c) after the operation b), applying a stripping agent to a peripheral region of the upper surface of the substrate while rotating the substrate about a central axis pointing in an up-down direction, to strip off a portion of the coating that is formed on the peripheral region from the substrate, and d) after the operation b), injecting a gas toward a boundary portion between the peripheral region of the upper surface of the substrate and an inner region that is located inward of the peripheral region, to accelerate solidification of an outer edge portion of the coating formed on the inner region. With this substrate processing method, it is possible to suppress the spread of the coating on the inner region to the peripheral region of the substrate.

In a preferred embodiment of the present invention, the substrate processing method further includes, between the operations a) and b), supplying a solvent to the upper surface of the substrate to form a solvent film that is a film of the solvent on the upper surface and to fill the clearance in the structure with the solvent. The operation b) includes b1) supplying the processing liquid to the solvent film to replace the solvent existing in the clearance in the structure by the processing liquid, and b2) rotating the substrate about the central axis to remove the solvent from above the substrate.

In another preferred embodiment of the present invention, the gas injected in the operation d) is preheated to a temperature higher than an ordinary temperature.

In another preferred embodiment of the present invention, in the operation c), the stripping agent is ejected from above the substrate toward the peripheral region of the upper surface of the substrate.

In another preferred embodiment of the present invention, the operation d) is performed in parallel with the operation c).

In another preferred embodiment of the present invention, the substrate processing method further includes, between the operations b) and c), accelerating solidification of the coating.

The present invention is also intended for a substrate processing apparatus for processing a substrate. The substrate processing apparatus according to the present invention includes a substrate holder that holds a substrate in a horizontal position, the substrate having a structure formed on an upper surface thereof, a substrate rotation mechanism that rotates the substrate along with the substrate holder about a central axis pointing in an up-down direction, a liquid supply part that supplies a processing liquid to the upper surface of the substrate to form a coating that is a film of the processing liquid on the upper surface and to fill clearance in the structure with the processing liquid, a stripping agent application part that applies a stripping agent to a peripheral region of the upper surface of the substrate to strip off a portion of the coating that is formed on the peripheral region from the substrate, and a gas injection part that injects a gas toward a boundary portion between the peripheral region of the upper surface of the substrate and an inner region that is located inward of the peripheral region, to accelerate solidification of an outer edge portion of the coating formed on the inner region. With this substrate processing apparatus, it is possible to suppress the spread of the coating on the inner region to the peripheral region of the substrate.

In a preferred embodiment of the present invention, the gas injected from the gas injection part is preheated to a temperature higher than an ordinary temperature.

In another preferred embodiment of the present invention, the stripping agent application part includes a stripping agent nozzle that is disposed above the substrate and ejects the stripping agent toward the peripheral region of the upper surface of the substrate.

Preferably, the gas injection part includes a gas nozzle that is disposed above the substrate and injects the gas toward the boundary portion. The substrate processing apparatus further includes a support arm that supports the stripping agent nozzle and the gas nozzle, and an arm moving mechanism that moves the support arm.

More preferably, the gas nozzle is located forward of the stripping agent nozzle in a direction of rotation of the substrate holder.

In another preferred embodiment of the present invention, the injection of the gas from the gas injection part is performed in parallel with the application of the stripping agent from the stripping agent application part.

These and other objects, features, aspects and advantages of the present invention will become more apparent from the following detailed description of the present invention when taken in conjunction with the accompanying drawings.

DESCRIPTION OF EMBODIMENTS

Figure 1:
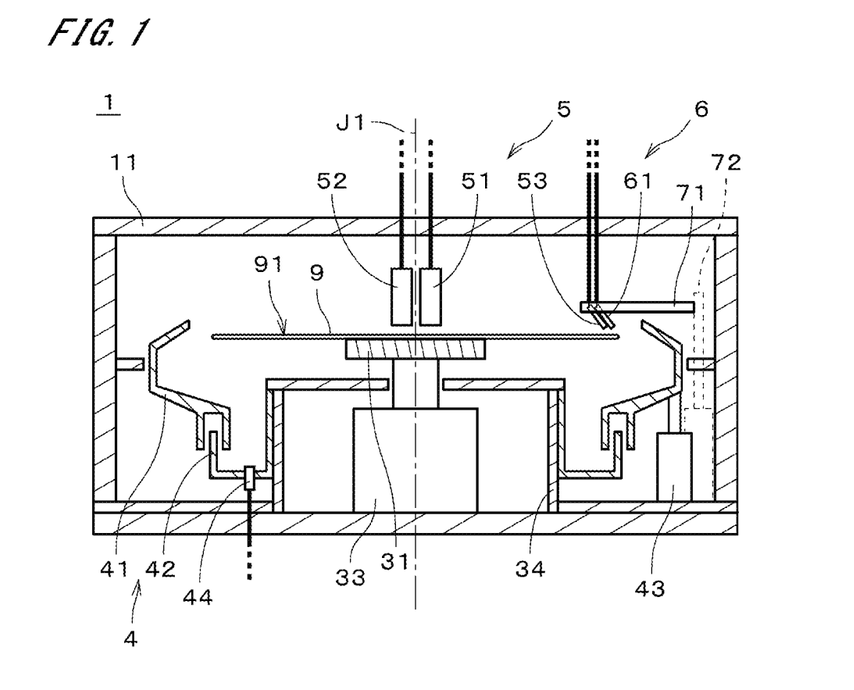
FIG. 1 illustrates a configuration of a substrate processing apparatus according to an embodiment.

FIG. 1 illustrates a configuration of a substrate processing apparatus 1 according to an embodiment of the present invention. The substrate processing apparatus 1 is a single wafer processing apparatus for processing semiconductor substrates 9 (hereinafter, simply referred to as "substrates 9") one at a time. The substrate processing apparatus 1 supplies a processing liquid to a substrate 9 to perform processing on the substrate 9. FIG. 1 illustrates part of the configuration of the substrate processing apparatus 1 in cross-section.

The substrate processing apparatus 1 includes a chamber 11, a substrate holder 31, a substrate rotation mechanism 33, a cup part 4, a processing liquid supply part 5, a gas injection part 6, a support arm 71, and an arm moving mechanism 72. The chamber 11 houses the substrate holder 31, the cup part 4, and other constituent elements therein.

The substrate holder 31 is a so-called vacuum chuck that holds the central portion of the substrate 9 by vacuum absorption. The substrate holder 31 is provided so as to be rotatable about a central axis J1 pointing in the up-down direction. The substrate 9 is placed above the substrate holder 31. The substrate 9 is held in a horizontal position by absorption by the substrate holder 31 within the chamber 11. The substrate rotation mechanism 33 is disposed below the substrate holder 31. The substrate rotation mechanism 33 drives the substrate 9 rotationally about the central axis J1, along with the substrate holder 31. The substrate rotation mechanism 33 is housed in a rotation mechanism housing part 34 that has a covered generally cylindrical shape.

The processing liquid supply part 5 supplies a plurality of types of processing liquids individually to the substrate 9. Examples of the plurality of types of processing liquids include a chemical solution, a rinsing liquid, a solvent, and a filler solution, which will be described later. The processing liquid supply part 5 includes a first nozzle 51, a second nozzle 52, and a third nozzle 53. The first nozzle 51 and the second nozzle 52 each supply a processing liquid from above the substrate 9 toward the upper main surface (hereinafter referred to as the "upper surface 91") of the substrate 9. While the processing liquid is being supplied from the first nozzle 51 to the substrate 9, the second nozzle 52 and the third nozzle 53 are located in their retracted positions radially outward of the substrate 9. While the processing liquid is being supplied from the second nozzle 52 to the substrate 9, the first nozzle 51 and the third nozzle 53 are located in their retracted positions radially outward of the substrate 9, and the second nozzle 52 is located above the substrate 9. The third nozzle 53 supplies a processing liquid from above the substrate 9 toward a peripheral region (i.e., edge portion) of the upper surface 91 of the substrate 9. FIG. 1 illustrates the first nozzle 51, the second nozzle 52, and the third nozzle 53 that are located above the substrate 9.

The gas injection part 6 injects a gas toward the upper surface 91 of the substrate 9. The gas injection part 6 includes a gas nozzle 61 that is disposed above the substrate 9. The gas nozzle 61 is mounted along with the third nozzle 53 on one end of the support arm 71 that extends generally horizontally. In other words, the support arm 71 supports the third nozzle 53 and the gas nozzle 61. The other end of the support arm 71 is connected to the arm moving mechanism 72 for moving the support arm 71. The arm moving mechanism 72 rotates the support arm 71 generally horizontally so as to move the gas nozzle 61 and the third nozzle 53 between positions above the substrate 9 and positions radially outward of the substrate 9.

Figure 2:
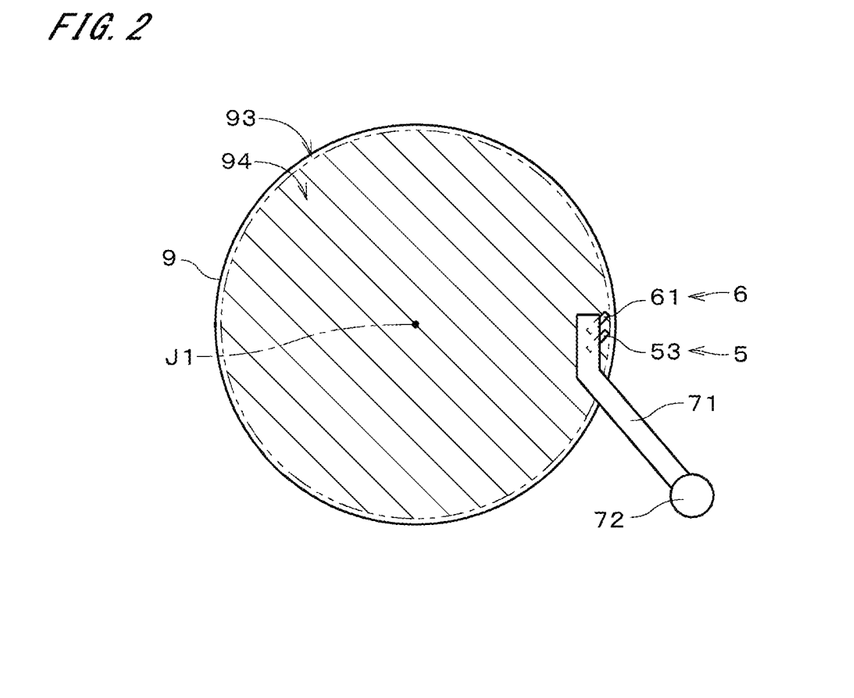
FIG. 2 is a plan view illustrating the vicinity of a gas nozzle.

FIG. 2 is a plan view illustrating the gas nozzle 61 and the vicinity of the gas nozzle 61. FIG. 2 illustrates a state in which the gas nozzle 61 and the third nozzle 53 are located above the peripheral region 93 of the substrate 9. In order to facilitate understanding of the drawing, an inner region 94 of the upper surface 91 of the substrate 9 that is a region radially inward of the peripheral region 93 is crosshatched, and the boundary between the peripheral region 93 and the inner region 94 is indicated by the dashed double-dotted line in FIG. 2. On the upper surface 91 of the substrate 9, a structure (i.e., circuit pattern) that is a group of a large number of fine structural elements is formed on the inner region 94, and that structure is not formed on the peripheral region 93.

The direction in which the substrate 9 is rotated by the substrate rotation mechanism 33 is the counterclockwise direction in FIG. 2. The gas nozzle 61 is mounted on the support arm 71 while facing forward in the rotation direction of the substrate holder 31 and the substrate 9 and radially outward with respect to the tangential direction of the substrate 9 disposed below the gas nozzle 61. The angle formed by the direction of injection of the gas from the gas nozzle 61 and the aforementioned tangential direction is approximately 45 degrees. Similarly to the gas nozzle 61, the third nozzle 53 is also mounted on the support arm 71 while facing forward in the rotation direction of the substrate 9 and radially outward with respect to the tangential direction of the substrate 9 disposed below the third nozzle 53. The angle formed by the direction of ejection of the processing liquid from the third nozzle 53 and the aforementioned tangential direction is approximately 45 degrees. In the example illustrated in FIG. 2, the gas nozzle 61 is located forward of the third nozzle 53 in the rotation direction of the substrate holder 31 and the substrate 9.

The cup part 4 illustrated in FIG. 1 is a ring-shaped member centered on the central axis J1 and is disposed around the substrate 9 and the substrate holder 31. The cup part 4 includes an upper cup part 41, a lower cup part 42, and a cup moving mechanism 43. The upper cup part 41 is a generally cylindrical member centered on the central axis J1. The upper cup part 41 is disposed radially outward of the substrate 9 and the substrate holder 31 and covers the sides of the substrate 9 and the substrate holder 31 throughout the peripheries thereof. The upper cup part 41 receives processing liquids or other fluids dispersed from the rotating substrate 9 to the surroundings. The cup moving mechanism 43 moves the upper cup part 41 in the up-down direction. The upper cup part 41 is moved by the cup moving mechanism 43 between a processing position, i.e., the position around the substrate 9 illustrated in FIG. 1, and a retracted position located below the processing position.

The lower cup part 42 is a bottomed generally cylindrical member centered on the central axis J1. The lower cup part 42 is disposed radially outward of the rotation mechanism housing part 34 below the upper cup part 41. For example, the lower cup part 42 is fixed to the outer side face of the rotation mechanism housing part 34. The lower cup part 42 is connected to the lower portion of the upper cup part 41. Specifically, the lower end of the upper cup part 41 is inserted into the inside of the lower cup part 42. The lower cup part 42 receives processing liquids or other fluids received by the upper cup part 41. The bottom of the lower cup part 42 has a drain port 44 through which the processing liquids or other fluids received by the lower cup part 42 are drained. The drain port 44 is connected to a drain tube that guides the processing liquids or other fluids to the outside of the chamber 11.

Figure 3:
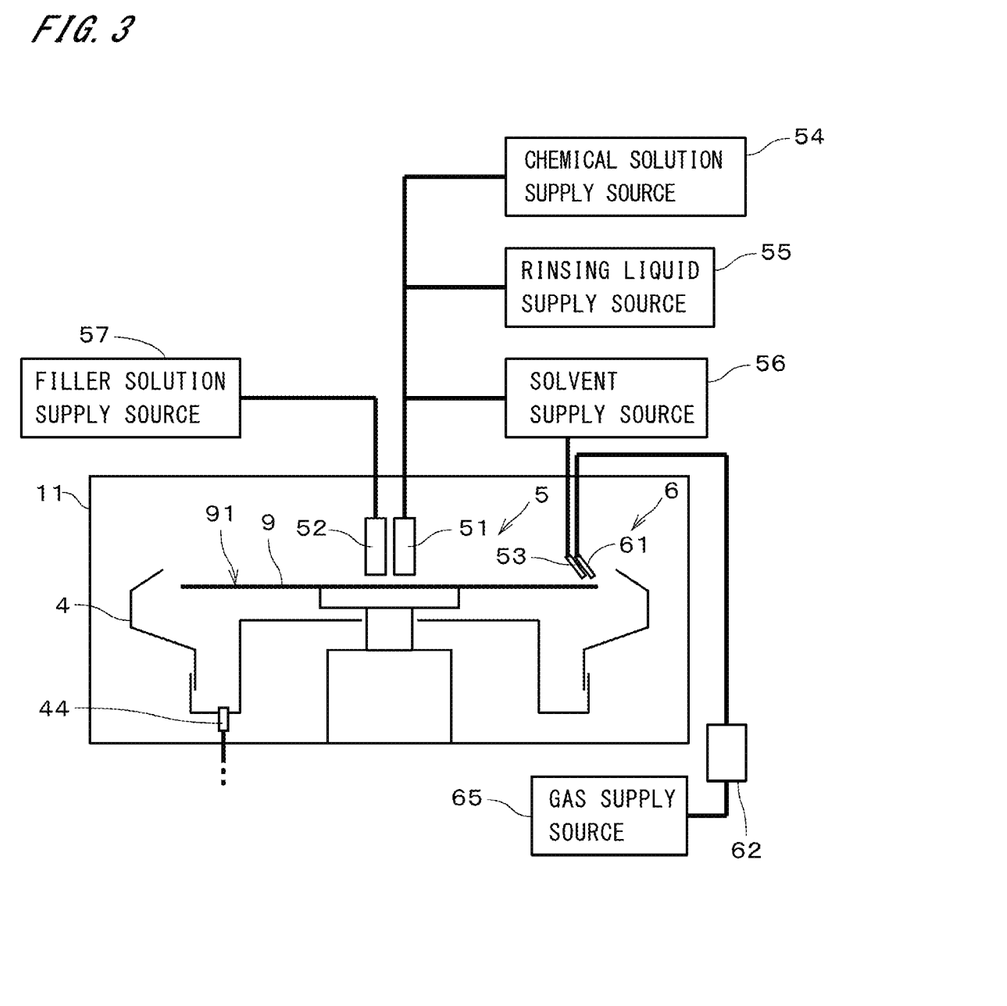
FIG. 3 is a block diagram illustrating a processing liquid supply part and a gas injection part.

FIG. 3 is a block diagram illustrating the processing liquid supply part 5 and the gas injection part 6 of the substrate processing apparatus 1. FIG. 3 also illustrates the configuration other than the processing liquid supply part 5 and the gas injection part 6. The first nozzle 51 is connected to a chemical solution supply source 54, a rinsing liquid supply source 55, and a solvent supply source 56. The second nozzle 52 is connected to a filler solution supply source 57. The third nozzle 53 is connected to the solvent supply source 56.

The chemical solution sent out of the chemical solution supply source 54 is supplied through the first nozzle 51 to the central portion of the upper surface 91 of the substrate 9. As an example of the chemical solution, an etchant such as an aqueous solution of hydrofluoric acid or tetramethylammonium hydroxide is used. The rinsing liquid sent out of the rinsing liquid supply source 55 is also supplied through the first nozzle 51 to the central portion of the upper surface 91 of the substrate 9. As an example of the rinsing liquid, deionized water (DIW) or carbonated water is used. The solvent sent out of the solvent supply source 56 to the first nozzle 51 is supplied through the first nozzle 51 to the central portion of the upper surface 91 of the substrate 9. As an example of the solvent, an organic solvent such as isopropyl alcohol (IPA), methanol, ethanol, or acetone is used. The solvent has a lower surface tension than the aforementioned rinsing liquid (e.g., deionized water). In the present embodiment, IPA is used as the solvent.

The lower end of the first nozzle 51 has, for example, a plurality of ejection ports for chemical solutions, rinsing liquids, and solvents so that different types of processing liquids are supplied through different piping and different ejection ports to the upper surface 91 of the substrate 9. For example, instead of the first nozzle 51, the processing liquid supply part 5 may include a plurality of processing liquid nozzles that respectively supply a chemical solution, a rinsing liquid, and a solvent to the central portion of the upper surface 91 of the substrate 9.

The filler solution sent out of the filler solution supply source 57 to the second nozzle 52 is supplied through the second nozzle 52 to the central portion of the upper surface 91 of the substrate 9. That is, the second nozzle 52 is included in a liquid supply part that supplies a filler solution to the upper surface 91 of the substrate 9. As an example of the filler solution, a liquid solution of polymer (resin) that a solid dissolved substance in a solvent is used. For example, an acrylic resin is used as the polymer. In the case where the polymer is insoluble in water, for example an organic solvent such as alcohol is used as the solvent. In the case where the polymer is soluble in water, for example deionized water is used as the solvent. In the present embodiment, a liquid solution of water-insoluble polymer in IPA is used as the filler solution. The filler solution has a higher specific gravity than the aforementioned solvent. The filler solution also has a higher surface tension than the aforementioned solvent. The polymer solidifies as a result of vaporization of the solvent on the substrate 9 and causes a crosslinking reaction as a result of being heated to a predetermined temperature or higher. The polymer is to be sublimated by an apparatus that is separate from the substrate processing apparatus 1, and is also called a sublimation agent.

The solvent sent out of the solvent supply source 56 to the third nozzle 53 is supplied through the third nozzle 53 to the peripheral region 93 (see FIG. 2) of the upper surface 91 of the substrate 9.

The gas nozzle 61 is connected to a gas supply source 65. The gas injection part 6 further includes a gas heater 62 that is disposed between the gas nozzle 61 and the gas supply source 65. The gas sent out of the gas supply source 65 is preheated to a temperature higher than the ordinary temperature by the gas heater 62 and then supplied to the gas nozzle 61. The heated gas is injected through the gas nozzle 61 toward the boundary portion between the peripheral region 93 and inner region 94 (see FIG. 2) of the upper surface 91 of the substrate 9. The gas injected from the gas nozzle 61 is, for example, an inert gas such as nitrogen. Alternatively, various types of gas such as dry air may be used as this gas.

Figure 4:
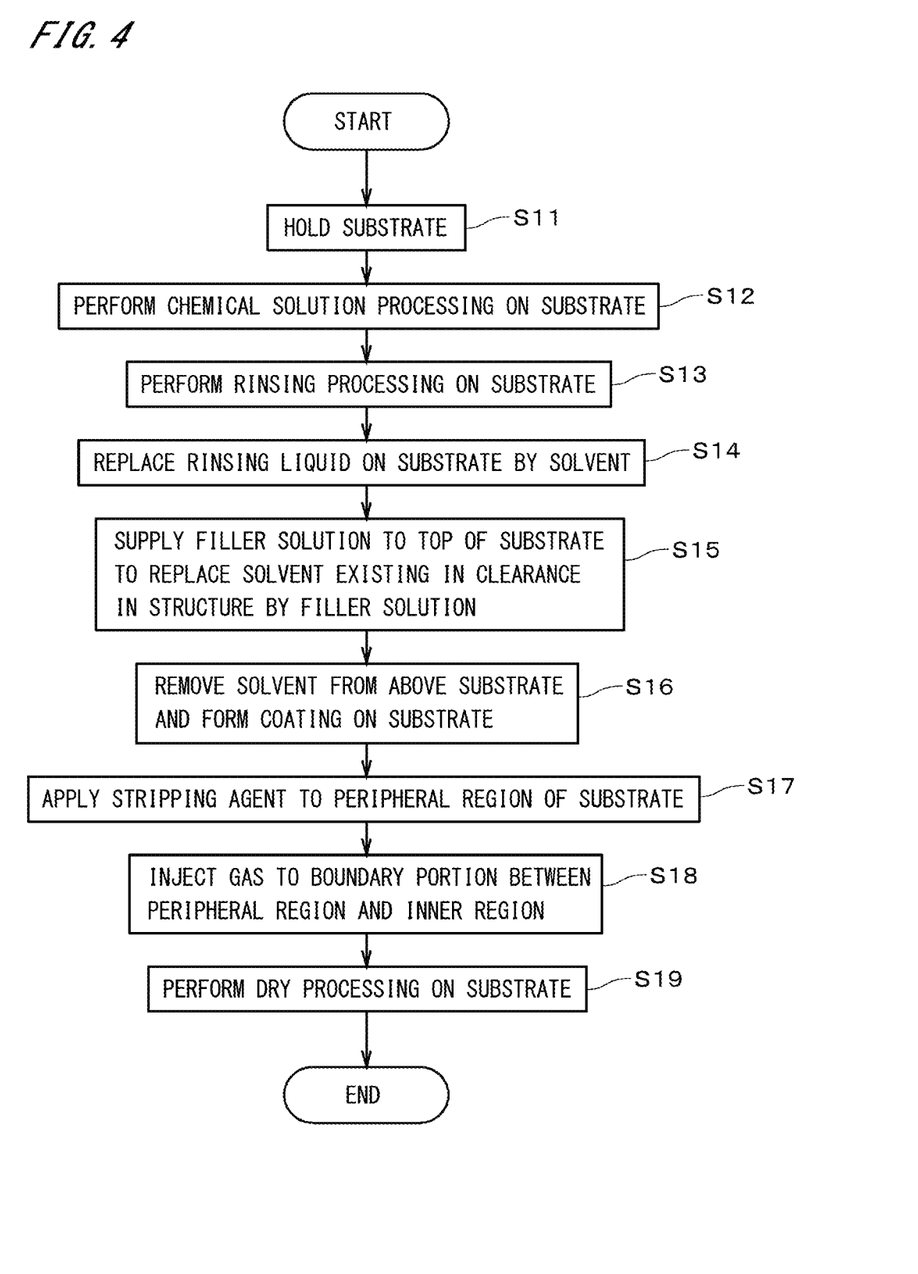
FIG. 4 illustrates a flow of processing that is performed on a substrate.

The substrate processing apparatus 1 performs processing on the substrate 9, for example, in the following order: chemical solution processing, rinse processing, solvent replacement processing, solvent filling processing, edge rinse processing, and dry processing. FIG. 4 illustrates an example of the flow of processing that the substrate processing apparatus 1 performs on the substrate 9. First, the substrate 9 with the aforementioned structure formed on the upper surface 91 is held in a horizontal position by the substrate holder 31 (step S11). Next, rotation of the substrate 9 is started, and a chemical solution is supplied from the first nozzle 51 to the substrate 9 that is being rotated at a relatively high rotation speed. The supply of the chemical solution continues for a predetermined period of time so that chemical solution processing (i.e., etching processing using a chemical solution) is performed on the substrate 9 (step S12).

When the supply of the chemical solution is stopped, a rinsing liquid is supplied from the first nozzle 51 to the substrate 9 that is being rotated at a relatively high rotation speed. The supply of the rinsing liquid continues for a predetermined period of time so that rinse processing is performed on the substrate 9 (step S13). In the rinse processing, the chemical solution on the substrate 9 is washed away with the rinsing liquid (e.g., deionized water) supplied from the first nozzle 51. When the above predetermined period of time has elapsed, the rotation speed of the substrate 9 is gradually reduced to a rotation speed (hereinafter, referred to as a "liquid film retention speed") that is enough lower than the aforementioned rotation speed. The rotation speed of the substrate 9 is reduced to, for example, 10 rpm. In this state, a liquid film of the rinsing liquid is formed and held on the upper surface 91 of the substrate 9.

Next, the supply of the rinsing liquid is stopped, and a solvent is supplied from the first nozzle 51 to the substrate 9 that is being rotated at the aforementioned liquid film retention speed. Then, the rotation speed of the substrate 9 is gradually increased from the liquid film retention speed while the supply of the solvent continues, so that the substrate 9 is rotated at a relatively high rotation speed. As a result, the solvent spreads radially outward from the central portion of the upper surface 91 of the substrate 9, and the rinsing liquid on the substrate 9 is replaced by the solvent. On the upper surface 91 of the substrate 9, a thin liquid film of the solvent (hereinafter, referred to as a "solvent film") is formed and retained. Since the solvent has a low surface tension, it can easily enter clearance in the structure (i.e., space between adjacent structural elements of the structure) on the upper surface 91 of the substrate 9. Thus, the clearance in the structure is filled with the solvent (step S14). The solvent film has a thickness that covers at least approximately the height of the structure, or a thickness greater than that thickness. When the processing for replacing deionized water by the solvent has ended, the supply of the solvent is stopped.

Moreover, a filler solution is supplied from the second nozzle 52 to the substrate 9 that is being rotated at a speed maintained at the relatively high rotation speed in step S14. The filler solution supplied from the second nozzle 52 to the solvent film on the substrate 9 spreads radially outward from the central portion of the upper surface 91 by the rotation of the substrate 9. As a result, a liquid film of the filler solution is formed on the solvent film. Alternatively, the liquid film of the filler solution on the solvent film may be formed by first supplying the filler solution while the rotation of the substrate 9 is stopped and then starting the rotation of the substrate 9. The supply of the filler solution is stopped when a predetermined amount of filer solution has been supplied and the formation of the liquid film of the filler solution has ended. Then, the rotation speed of the substrate 9 is reduced to, for example, the aforementioned liquid film retention speed.

As described above, approximately the entire upper surface 91 of the substrate 9 is covered with the solvent film, and approximately the entire upper surface of the solvent film is covered with the liquid film of the filler solution. Since the filler solution has a higher specific gravity than the solvent, the solvent film and the liquid film of the filler solution change their vertical positions with each other. Accordingly, the solvent existing in the clearance in the structure on the upper surface 91 of the substrate 9 is replaced by the filler solution, and the clearance in the structure is filled with the filler solution (step S15). In other words, step S15 is filler filling processing (i.e., filler embedding processing) for embedding a filler between adjacent structural elements in the structure. On the substrate 9, the liquid film of the filler solution is located on the upper surface 91, and the solvent film is located on the liquid film of the filler solution.

When step S15 has ended, the rotation speed of the substrate 9 is increased, and the solvent film on the liquid film of the filler solution is removed from the top of the substrate 9. Also, a surplus of the filler solution is removed from the top of the substrate 9. The rotation speed of the substrate 9 at this time is a speed that does not cause the filler embedded in the clearance (i.e., space between adjacent structural elements) in the structure on the substrate 9 in step S15 to be thrown outward by centrifugal force. For example, the substrate 9 is driven rotationally at a rotation speed of 300 rpm to 500 rpm. As a result, a coating that is a film of the filler solution is formed on the upper surface 91 of the substrate 9 (step S16). This coating has a thickness that is required to cover the entire structure. On the substrate 9, the solvent contained in the filler solution is vaporized, which thereby proceeds the solidification of the coating.

Thereafter, a solvent is continuously supplied from the third nozzle 53 to the peripheral region 93 of the upper surface 91 of the substrate 9 while the substrate 9 is being rotated, so that edge rinse processing is performed to remove the filler solution on the peripheral region 93 of the substrate 9 (step S17). In step S17, the filler solution adhering to the side face of the substrate 9 is also removed, in addition to the filler solution on the peripheral region 93 of the substrate 9.

In step S17, for example, the substrate 9 is rotated at a speed of 300 to 500 rpm as in step S16. The solvent (in the present embodiment, IPA) applied from the third nozzle 53 to the peripheral region 93 of the substrate 9 in step S17 serves as a stripping agent that causes the coating on the peripheral region 93, out of the coating on the substrate 9, to be stripped off the top of the substrate 9. In the present embodiment, the stripping agent is a liquid of the same type as the solvent of the filler solution. Also, the third nozzle 53 serves as a stripping agent nozzle that is disposed above the substrate 9 and ejects the stripping agent from above the substrate 9 toward the peripheral region 93 of the upper surface 91 of the substrate 9. The stripping agent nozzle is included in a stripping agent application part that applies a stripping agent to the peripheral region 93 of the upper surface 91 of the substrate 9.

In the substrate processing apparatus 1, in parallel with step S17, a gas is injected from the gas nozzle 61 of the gas injection part 6 toward the boundary portion between the peripheral region 93 and inner region 94 of the upper surface 91 of the substrate 9. This accelerates the solidification of the outer edge portion of the coating (i.e., filler solution) on the inner region 94 (step S18). For example, step S18 is started with a slight delay from the start of step S17, and thereafter steps S17 and S18 are performed in parallel. As described above, the gas injected toward the substrate 9 in step S18 is preheated to a temperature higher than the ordinary temperature by the gas heater 62 illustrated in FIG. 3. For example, step S18 may end simultaneously with the end of step S17, or may end after a predetermine period of time has elapsed since the end of step S17.

When steps S17 and S18 have ended, dry processing is performed on the substrate 9 (step S19). In step S19, the substrate holder 31 is driven rotationally at a rotation speed similar to that in step S16 while the substrate 9 is held by the substrate holder 31. Accordingly, the stripping agent (in the above-described example, IPA) applied to the peripheral region 93 of the substrate 9 is dispersed radially outward from the outer edge of the substrate 9 by centrifugal force and removed from the top of the substrate 9. The chemical solution, the rinsing liquid, the solvent, and the filler solution (i.e., processing liquids) that are dispersed radially outward from the top of the substrate 9 in the aforementioned steps S12 to S19 are received by the cup part 4 and drained out of the chamber 11 through the drain port 44.

The substrate 9 that has undergone the dry processing is transported out of the substrate processing apparatus 1 and transported into a next processing apparatus (not shown). Then, the next processing apparatus heats the substrate 9 and performs processing for solidifying the filler embedded in the clearance (i.e., space between adjacent structural elements) in the structure on the substrate 9. Since the filler on the peripheral region 93 of the substrate 9 has already been removed, a transport mechanism is prevented from being soiled with the filler when the substrate 9 is transported from the substrate processing apparatus 1 to the next processing apparatus. The substrate processing apparatus 1 sequentially performs the aforementioned steps S11 to S19 on a plurality of substrates 9.

As described above, when the substrate processing apparatus 1 performs processing on the substrate 9, first the substrate 9 with a structure formed on the upper surface 91 is held in a horizontal position. Then, the filler solution is supplied to the upper surface 91 of the substrate 9. Accordingly, the coating that is a film of the filler solution is formed on the upper surface 91 of the substrate 9, and the clearance in the above-described structure is filled with the filler solution. Then, after the formation of the coating, the stripping agent is applied to the peripheral region 93 of the upper surface 91 of the substrate 9 while the substrate 9 is being rotated about the central axis J1, so that a portion of the coating that is formed on the peripheral region 93 is stripped off the substrate 9 (step S17). Also, after the formation of the coating, a gas is injected toward the boundary portion between the peripheral region 93 and the inner region 94 of the upper surface 91 of the substrate 9 so as to accelerate the solidification of the outer edge portion of the coating on the inner region 94 (step S18).

By ejecting the gas to the aforementioned boundary portion, the substrate processing apparatus 1 accelerates the vaporization of the solvent on the outer edge portion of the coating on the inner region 94 and accelerates the solidification of this outer edge portion. This avoids a situation where the stripping agent applied to the peripheral region 93 causes slack in the outer edge portion of the coating on the inner region 94. As a result, it is possible to suppress the spread of the coating on the inner region 94 to the top of the peripheral region 93 by centrifugal force caused by the rotation of the substrate 9 during subsequent processing (e.g., dry processing) that is performed after the edge rinse processing in step S17. In other words, it is possible to favorably complete the edge rinse processing performed on the substrate 9.

In the aforementioned example, the acceleration of the solidification of the outer edge portion of the coating on the inner region 94 (step S18) is performed in parallel with the application of the stripping agent to the peripheral region 93 (step S17). Thus, the gas can be injected to the coating immediately after the stripping agent is applied to the coating. As a result, it is possible to further avoid a situation where the stripping agent applied to the peripheral region 93 causes slack in the outer edge portion of the coating on the inner region 94 and to further suppress the spread of the coating on the inner region 94 to the top of the peripheral region 93.

In the substrate processing apparatus 1, step S18 may be performed after step S17. For example, in the case where the rotation speed of the substrate 9 at the end of the edge rinse processing in step S17 is such a speed that does not cause the spread of the coating on the inner region 94 to the peripheral region 93, step S18 may be performed after the end of the edge rinse processing in step S17 and before the dry processing in step S19. Alternatively, step S18 may be started simultaneously with step S17, or may be performed before step S17. For example, in the case where step S18 is performed before step S17, the edge rinse processing is performed after the solidification of the outer edge portion of the coating on the inner region 94 has progressed in advance with the aid of the gas injected toward the boundary portion between the peripheral region 93 and inner region 94 of the substrate 9. Thus, it is possible to further suppress slack in the outer edge portion of the coating on the inner region 94. In other words, it is sufficient that the acceleration of the solidification of the outer edge portion of the coating in step S18 be performed after the formation of the coating in step S16. By so doing, as in the aforementioned example, it is possible to suppress the spread of the coating on the inner region 94 to the top of the peripheral region 93.

In the substrate processing apparatus 1, the gas injected from the gas injection part 6 is preheated to a temperature higher than the ordinary temperature. This further accelerates the solidification of the outer edge portion of the coating on the inner region 94 in step S18. Note that in the case where the coating is relatively highly volatile, that gas does not necessarily have to be at a high temperature, and may be at the ordinary temperature.

The stripping agent application part includes the stripping agent nozzle (i.e., third nozzle 53) that is disposed above the substrate 9 and ejects the stripping agent toward the peripheral region 93 of the upper surface 91 of the substrate 9. Thus, the stripping agent can be easily applied to the peripheral region 93 of the upper surface 91 of the substrate 9.

As described above, the gas injection part 6 includes the gas nozzle 61 that is disposed above the substrate 9 and injects the gas toward the boundary portion between the peripheral region 93 and the inner region 94. Also, the substrate processing apparatus 1 further includes the support arm 71 that supports the third nozzle 53 serving as the stripping agent nozzle and the gas nozzle 61, and the arm moving mechanism 72 for moving the support arm 71. Thus, the third nozzle 53 and the gas nozzle 61 can be moved between the processing positions above the substrate 9 and the retracted positions radially outward of the substrate 9 while maintaining their relative positions. Accordingly, the relative positional relationship between the ejection position of the stripping agent from the third nozzle 53 and the injection position of the gas from the gas nozzle 61 on the substrate 9 can always be maintained. As a result, it is possible to stabilize the quality of the edge rinse processing performed on the substrate 9.

In the substrate processing apparatus 1, the gas nozzle 61 is located forward of the third nozzle 53 in the rotation direction of the substrate holder 31 (i.e., located downstream in the rotation direction). Thus, the gas can be injected to the coating immediately after the stripping agent is applied from the third nozzle 53. As a result, it is possible to further avoid a situation where the stripping agent applied to the peripheral region 93 causes slack in the outer edge portion of the coating on the inner region 94 and to further suppress the spread of the coating on the inner region 94 to the top of the peripheral region 93.

Note that the substrate processing apparatus 1 may accelerate the solidification of the above-described coating on the substrate 9 by, for example, building a heater (not shown) in the substrate holder 31 and heating the substrate 9 after step S16 (i.e., between step S16 and step S17). The solidification of the coating does not necessarily have to be accelerated by heating the substrate 9 with the heater. For example, the solidification of the coating may be accelerated by irradiating the coating on the substrate 9 with light. As another alternative, the solidification of the coating may be accelerated by applying a heated gas to the entire coating on the substrate 9. In this way, if the coating on the substrate 9 is solidified in advance to some extent before the application of the stripping agent to the peripheral region 93, it is possible to suppress slack occurring in the coating when the stripping agent is applied to the coating. As a result, it is possible to further suppress the spread of the coating on the inner region 94 to the top of the peripheral region 93.

In the substrate processing apparatus 1, as described above, the solvent is supplied to the upper surface 91 of the substrate 9 to form the solvent film on the upper surface 91, and the clearance in the aforementioned structure is filled with the solvent (step S14) between the holding of the substrate 9 (step S11) and the formation of the coating (steps S15 and S16). The step of forming the coating includes the step of supplying the filler solution to the solvent film to replace the solvent existing in the clearance in the structure by the filler solution (step S15) and the step of rotating the substrate 9 about the central axis J1 to remove the solvent from the top of the substrate 9 (step S16). This facilitates filling the clearance in the structure with the filler solution and forming the coating of the filler solution.

The aforementioned substrate processing apparatus 1 can be modified in various ways.

For example, the gas injected from the gas nozzle 61 does not necessarily have to be at a temperature higher than the ordinary temperature, and may be at the ordinary temperature or at a temperature lower than the ordinary temperature.

The gas nozzle 61 does not necessarily have to located forward of the third nozzle 53 (i.e., stripping agent nozzle) in the rotation direction of the substrate holder 31. For example, the gas nozzle 61 may be located rearward of the third nozzle 53 in the rotation direction of the substrate holder 31 and supported by the support arm 71 along with the third nozzle 53. Even in this case, if the rotation speed of the substrate holder 31 is high to some extent, the gas can be injected from the gas nozzle 61 to a portion of the coating immediately after the stripping agent is applied from the third nozzle 53. Also, the gas nozzle 61 does not necessarily have to be supported by the support arm 71 along with the third nozzle 53, and may be movable separately from the third nozzle 53.

The third nozzle 53 does not necessarily have to be disposed above the substrate 9. For example, a plurality of third nozzles 53 may be aligned in the circumferential direction below the substrate 9, and a stripping agent may be ejected from the plurality of third nozzles 53 toward the lower surface of the rotating substrate 9. The stripping agent will flow radially outward along the lower surface of the substrate 9 and along the side face of the substrate 9 and will be applied to the peripheral region 93 of the upper surface 91. In this case, for example, a plurality of gas nozzles 61 may be aligned in the circumferential direction above the substrate 9, and a gas may be injected from the plurality of gas nozzles 61 toward the boundary portion between the peripheral region 93 and the inner region 94 so as to accelerate the solidification of the outer edge portion of the coating on the inner region 94. Even in this case, in the same manner as described above, it is possible to avoid a situation where the stripping agent applied to the peripheral region 93 causes slack in the outer edge portion of the coating on the inner region 94. As a result, it is possible to suppress the spread of the coating on the inner region 94 to the top of the peripheral region 93.

The substrate processing apparatus 1 does not necessarily have to use the method of steps S15 and S16 to form the coating on the substrate 9, and may use other various methods. Moreover, steps (steps S12 to S14) that are performed before the formation of the coating may be modified in various ways. For example, in step S12, various types of chemical solutions may be supplied to the substrate 9, and various types of chemical solution processing may be performed on the substrate 9.

For example, the filler solution may be a liquid solution of water-soluble polymer in a solvent such as deionized water. In this case, for example, deionized water is used as the stripping agent. The stripping agent does not necessarily have to be a liquid of the same type as the solvent in the filler solution, and various liquids may be used as the stripping agent.

In addition to semiconductor substrates, the aforementioned substrate processing apparatus 1 may also be used to process glass substrates for use in display devices such as liquid crystal displays, plasma displays, and field emission displays. Alternatively, the aforementioned substrate processing apparatus 1 may be used to process other substrates such as optical disk substrates, magnetic disk substrates, magneto-optical disk substrates, photomask substrates, ceramic substrates, and solar cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
6 Gas injection part
9 Substrate
31 Substrate holder
33 Substrate rotation mechanism
53 Third nozzle
61 Gas nozzle
71 Support arm
72 Arm moving mechanism
91 Upper surface (of substrate)
93 Peripheral region
94 Inner region
J1 Central axis
S11 to S19 Step

The invention claimed is:

1. A substrate processing method of processing a substrate, comprising:
   a) holding the substrate in a horizontal position, the substrate having a structure formed on an upper surface thereof; and
   b) supplying a processing liquid to said upper surface of said substrate to form a coating that is a film of said processing liquid on said upper surface of said substrate and to fill clearance in said structure with said processing liquid;
   wherein said substrate processing method further comprises, after said operation b),
   c) applying a stripping agent to a peripheral region of said upper surface of said substrate while rotating said substrate about a central axis pointing in an up-down direction, to strip off a portion of said coating that is formed on said peripheral region of said upper surface of said substrate from said substrate, and
   d) before, after, or in parallel with said operation c), injecting a gas toward only a boundary portion between said peripheral region of said upper surface of said substrate and an inner region of said upper surface of said substrate that is located inward of said peripheral region of said upper surface of said substrate, to accelerate solidification of only an outer edge portion of an inner region coating formed on said inner region of said upper surface of said substrate,
   wherein said substrate processing method further comprises
   e) after said operation c) and said operation d), solidifying said inner region coating formed on said inner region of said upper surface of said substrate, said inner region coating not having been solidified at the end of said operation c) and said operation d).

2. The substrate processing method according to claim 1, further comprising:
   f) after said operation c) and said operation d), and before said operation e), rotating said substrate about said central axis to remove said stripping agent from said peripheral region of said upper surface of said substrate.

3. The substrate processing method according to claim 1, further comprising:
   between said operations a) and b), supplying a solvent to said upper surface of said substrate to form a solvent film that is a film of said solvent on said upper surface of said substrate and to fill said clearance in said structure with said solvent, wherein said operation b) includes:
   b1) supplying said processing liquid to said solvent film to replace said solvent existing in said clearance in said structure by said processing liquid; and
   b2) said central axis to remove said solvent from above said substrate.

4. The substrate processing method according to claim 1, wherein
   said gas injected in said operation d) is preheated to a temperature higher than room temperature.

5. The substrate processing method according to claim 1, wherein
   in said operation c), said stripping agent is ejected from above said substrate toward said peripheral region of said upper surface of said substrate.

6. The substrate processing method according to claim 1, wherein
   said operation d) is performed in parallel with said operation c).

7. The substrate processing method according to claim 1, further comprising:
   between said operation b) and said operation c), accelerating solidification of said coating.

* * * * *